(12) United States Patent
Yoo et al.

(10) Patent No.: US 12,418,445 B2
(45) Date of Patent: Sep. 16, 2025

(54) LOW POWER PAM-4 OUTPUT TRANSMITTER

(71) Applicant: INDUSTRY-UNIVERSITY COOPERATION FOUNDATION HANYANG UNIVERSITY, Seoul (KR)

(72) Inventors: CHang Sik Yoo, Seoul (KR); Hyeong Min Seo, Seoul (KR); Ji Yun Han, Seoul (KR)

(73) Assignee: INDUSTRY-UNIVERSITY COOPERATION FOUNDATION HANYANG UNIVERSITY, Seoul (KR)

( * ) Notice: Subject to any disclaimer, the term of this patent is extended or adjusted under 35 U.S.C. 154(b) by 153 days.

(21) Appl. No.: 18/345,291

(22) Filed: Jun. 30, 2023

(65) Prior Publication Data
US 2023/0353431 A1 Nov. 2, 2023

Related U.S. Application Data

(63) Continuation of application No. PCT/KR2021/013502, filed on Oct. 1, 2021.

(30) Foreign Application Priority Data

Dec. 30, 2020 (KR) ........................ 10-2020-0187226

(51) Int. Cl.
*H04L 25/49* (2006.01)
*H03K 7/02* (2006.01)
(Continued)

(52) U.S. Cl.
CPC ........... *H04L 25/4917* (2013.01); *H03K 7/02* (2013.01); *H03K 19/20* (2013.01); *H04B 1/04* (2013.01);
(Continued)

(58) Field of Classification Search
CPC . H03K 7/00; H03K 7/02; H03K 19/20; H04B 1/04; H04B 14/02; H04B 14/023;
(Continued)

(56) References Cited

U.S. PATENT DOCUMENTS 8,963,641 B1 2/2015 Liu
2012/0064952 A1* 3/2012 Iijima ................ H03K 17/6221
455/571

(Continued)

FOREIGN PATENT DOCUMENTS

JP 2004531909 A 10/2004
KR 1020070027160 A 3/2007
(Continued)

*Primary Examiner* — Young T. Tse
(74) *Attorney, Agent, or Firm* — NKL Law; Jae Youn Kim

(57) ABSTRACT

A low power PAM-4 output transmitter is disclosed. The lower power PAM-4 output transmitter comprises a first source series terminated SST branch configured to include unit cells having transistors which are selectively activated in response to an input signal outputted from an encoder; a second SST branch configured to include unit cells having transistors which are selectively activated in response to a negative signal of the input signal; and a common voltage switch H3 configured to short or open the first SST branch and the second SST branch. Here, differential signals are outputted from both terminals of the first SST branch and the second SST branch by making the first SST branch and the second SST branch short or open according to an operation of the common voltage switch.

8 Claims, 5 Drawing Sheets

(51) Int. Cl.
*H03K 19/20* (2006.01)
*H04B 1/04* (2006.01)
*H04L 25/02* (2006.01)

(52) U.S. Cl.
CPC ........ *H04L 25/0272* (2013.01); *H04L 25/028* (2013.01)

(58) Field of Classification Search
CPC .............. H04L 25/0272; H04L 25/028; H04L 25/4917; H04L 27/02; H04L 27/04; H04Q 2213/1303
USPC .................. 375/295, 300, 353; 332/115, 116
See application file for complete search history.

(56) References Cited

U.S. PATENT DOCUMENTS

2015/0207526 A1\* 7/2015 Shi ..................... H10D 89/819
 375/295
2018/0129256 A1\* 5/2018 Hafizi .............. H03K 19/00315

FOREIGN PATENT DOCUMENTS

| KR | 1020140102265 A | 8/2014 |
| KR | 1020160074677 A | 6/2016 |

\* cited by examiner

|  | (MSB,LSB) | | | | | | | |
|---|---|---|---|---|---|---|---|---|
|  | (1,1) | (1,0) | (0,1) | (0,0) | (1,1) | (1,0) | (0,1) | (0,0) |
|  | common voltage switch is used | | | | common voltage switch is not used | | | |
| PUP1 | 0 | 0 | 1 | 1 | 0 | 1 | 0 | 1 |
| NDN1 | 0 | 0 | 1 | 1 | 0 | 1 | 0 | 1 |
| PUP2 | 0 | 1 | 1 | 1 | 0 | 0 | 1 | 1 |
| NDN2 | 0 | 0 | 0 | 1 | 0 | 0 | 1 | 1 |
| H3 | 0 | 1 | 1 | 0 | 0 | 0 | 0 | 0 |
| PUP1B | 1 | 1 | 0 | 0 | 1 | 0 | 1 | 0 |
| NDN1B | 1 | 1 | 0 | 0 | 1 | 0 | 1 | 0 |
| PUP2B | 1 | 1 | 1 | 0 | 1 | 1 | 0 | 0 |
| NDN2B | 1 | 0 | 0 | 0 | 1 | 1 | 0 | 0 |

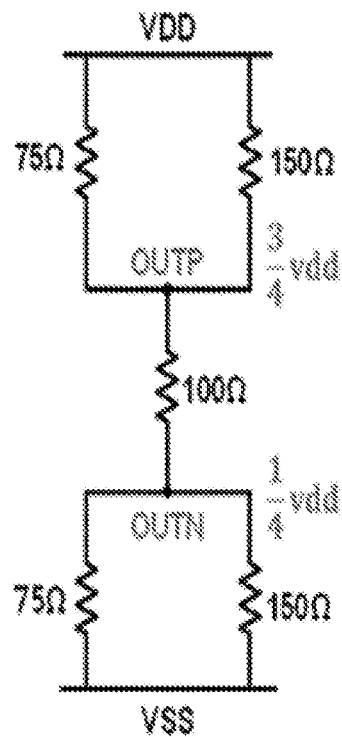
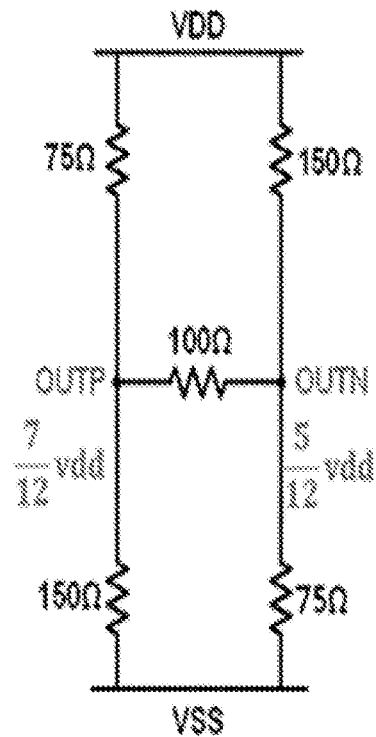
FIG. 5A                    FIG. 5B

LOW POWER PAM-4 OUTPUT TRANSMITTER

TECHNICAL FIELD

The disclosure relates to a low power PAM-4 output transmitter.

BACKGROUND ART

FIG. 1 is a view illustrating conventional Pulse Amplitude Modulation (PAM)-4 output driver. As shown in FIG. 1, the conventional PAM-4 output driver enhances an output swing using a current mode logic CML branch. However, power consumption increases because the conventional PAM-4 output driver uses the CML branch. FIG. 1 illustrates an example of a conventional PAM-4 output driver circuit configured to process a most significant bit (MSB). The output driver operates based on differential input signals MSB, and MSBn, which selectively drive upper and lower switching transistors (HP and HN), thereby generating an output voltage (VOUT) through a current source ($I_{nj}$). Each input path includes a termination resistor ($3R_T$) and a capacitor ($C_M$) to suppress signal reflection and noise. The output node is connected to a resistor network composed of 1.5RL, $2R_L$, and $1.5R_L$, which implements four distinct voltage levels required for PAM-4 signaling. This structure represents a typical MSB processing circuit for generating multi-level output signals in accordance with the PAM-4 scheme, and has been applied in high-speed serial transmitters and differential output drivers.

SUMMARY

The disclosure is to provide a PAM-4 output transmitter using a dual source series terminated SST branch.

Additionally, the disclosure is to provide a low power PAM-4 output transmitter using its own encoding method with employing a common voltage switch to reduce its power consumption.

A low power PAM-4 output transmitter according to an embodiment of the disclosure includes a first source series terminated SST branch configured to include unit cells having transistors which are selectively activated in response to an input signal outputted from an encoder; a second SST branch configured to include unit cells having transistors which are selectively activated in response to a negative signal of the input signal; and a common voltage switch H3 configured to short or open the first SST branch and the second SST branch. Here, differential signals are outputted from both terminals of the first SST branch and the second SST branch by making the first SST branch and the second SST branch short or open according to an operation of the common voltage switch.

A positive resistance of a resistor included in the first SST branch and the second SST branch is three times higher than an on resistance of the transistor. Here, the on resistance of the transistor is controlled by applying a control voltage to a gate electrode of a part of the transistors.

The first SST branch and the second SST branch include a first unit cell and a second unit cell, respectively. Here, each of the first unit cell and the second unit cell includes a first transistor, a second transistor, a third transistor and a fourth transistor, the first transistor and the second transistor are P-type Metal-Oxide-Semiconductor (PMOS) transistors, and the third transistor and the fourth transistor are N-type Metal-Oxide-Semiconductor (NMOS) transistors.

A gate electrode of the first transistor is connected to a first control voltage VBP, and a gate electrode of the fourth transistor is connected to a second control voltage VBN. Here, a gate electrode of the second transistor and a gate electrode of the third transistor are connected to an input buffer, a drain electrode of the second transistor and a drain electrode of the third transistor are connected to a resistor, and an operation of the second transistor and the third transistor is controlled by controlling the first control voltage and the second control voltage.

A drain electrode of the second transistor and a drain electrode of the third transistor in the first unit cell are connected to a first resistor, and a drain electrode of the second transistor and a drain electrode of the third transistor in the second unit cell are connected to a second resistor. Here, a positive resistance of the first resistor is twice a positive resistance of the second resistor.

Differential voltages are outputted from both terminals of the first resistor according as the second resistor becomes short or open by the common voltage switch.

The low power PAM-4 output transmitter of claim 4 further comprises an encoder configured to encode an input value to each of the unit cells by applying differently an encoding method based on a most significant bit MSB and a least significant bit LSB according as the common voltage switch is used or is not used.

An inverted value of the MSB is inputted to a first input buffer connected to a gate electrode of the second transistor included in the first unit cell of the first SST branch and a second input buffer connected to a gate electrode of the third transistor when the common voltage switch is used, an inverted value of the LSB is inputted to the first input buffer and the second input buffer when the common voltage switch is not used, a NAND gate value of the MSB and the LSB is inputted to a third input buffer connected to a gate electrode of the second transistor included in the second unit cell when the common voltage switch is used, an inverted value of the LSB is inputted to the third input buffer when the common voltage switch is not used, a NOR gate value of the MSB and the LSB is inputted to a fourth input buffer connected to a gate electrode of the third transistor included in the second unit cell when the common voltage switch is used, and an inverted value of the LSB is inputted to the fourth input buffer when the common voltage switch is not used.

A lower power PAM-4 output transmitter according to an embodiment of the disclosure uses a dual SST branch to reduce its power consumption.

Moreover, the PAM-4 output transmitter uses its own encoding method with employing a common voltage switch to reduce the power consumption.

BRIEF DESCRIPTION OF DRAWINGS

Example embodiments of the present disclosure will become more apparent by describing in detail example embodiments of the present disclosure with reference to the accompanying drawings, in which:

FIGS. 5A-5B are views illustrating an equivalent circuit of the PAM-4 driver in FIG. 1;

DETAILED DESCRIPTION

In the present specification, an expression used in the singular encompasses the expression of the plural, unless it has a clearly different meaning in the context. In the present specification, terms such as "comprising" or "including," etc., should not be interpreted as meaning that all of the elements or operations are necessarily included. That is, some of the elements or operations may not be included, while other additional elements or operations may be further included. Also, terms such as "unit," "module," etc., as used in the present specification may refer to a part for processing at least one function or action and may be implemented as hardware, software, or a combination of hardware and software.

Hereinafter, various embodiments of the disclosure will be described in detail with reference to accompanying drawings.

Figure 1:
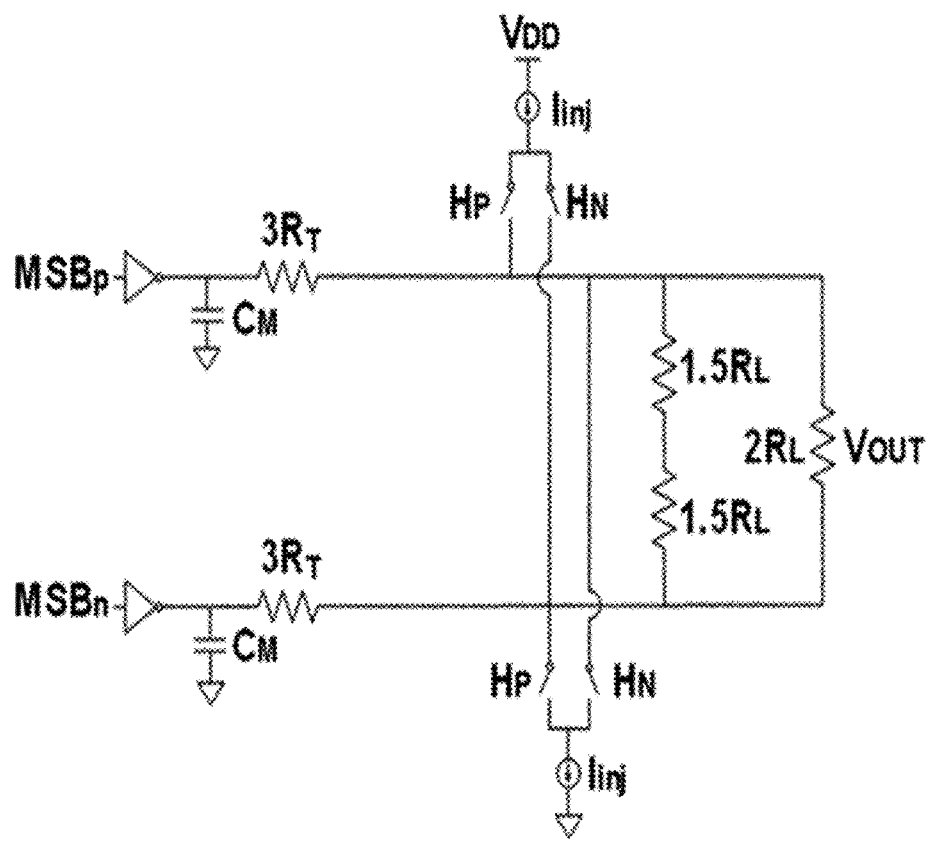
FIG. 1 is a view illustrating conventional PAM-4 output driver.
Figure 2:
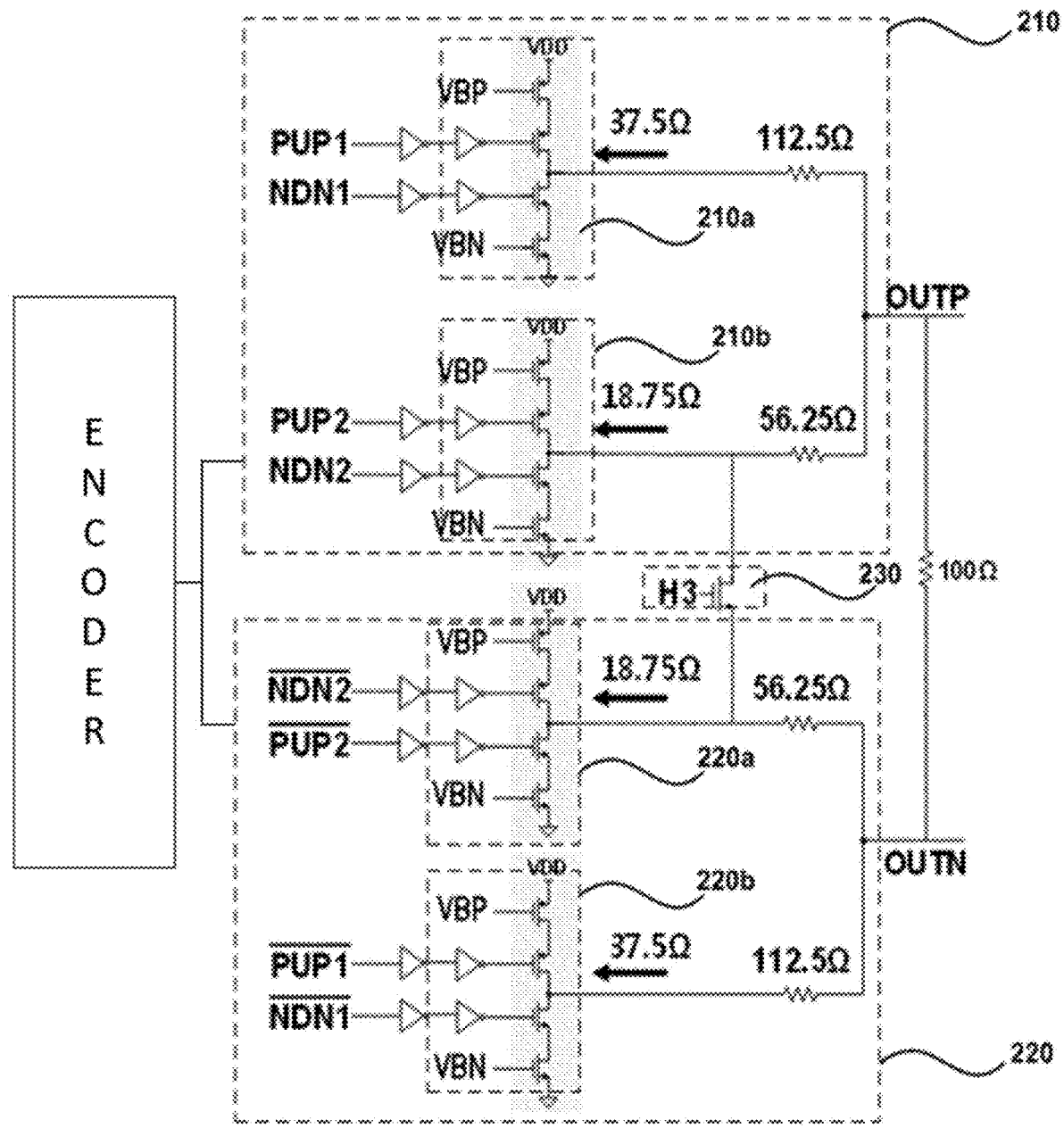
FIG. 2 is a view illustrating a PAM-4 output transmitter according to an embodiment of the disclosure.
Figures 3, 4A, 4B:
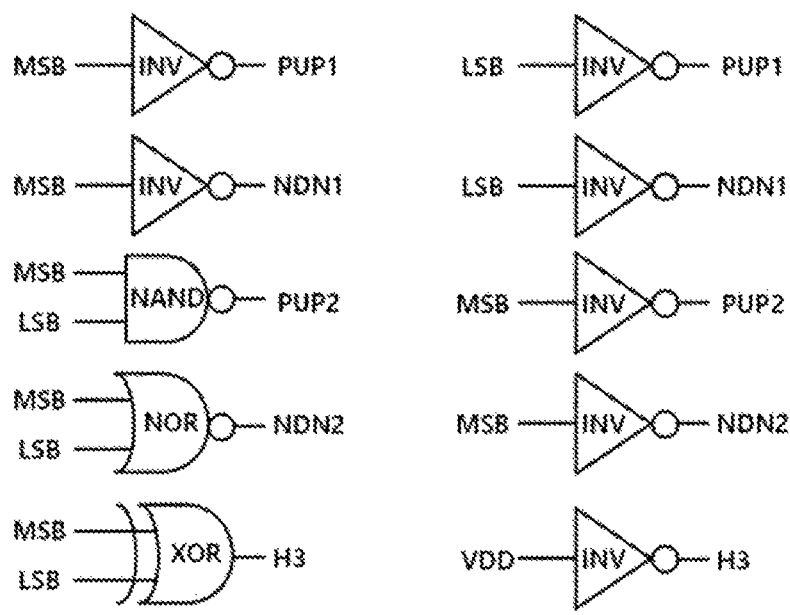
FIG. 3 is a view illustrating an output of an encoder according to an embodiment of the disclosure.
FIGS. 4A-4B are views illustrating an encoding method according to usage of a common voltage switch according an embodiment of the disclosure.
Figure 6:
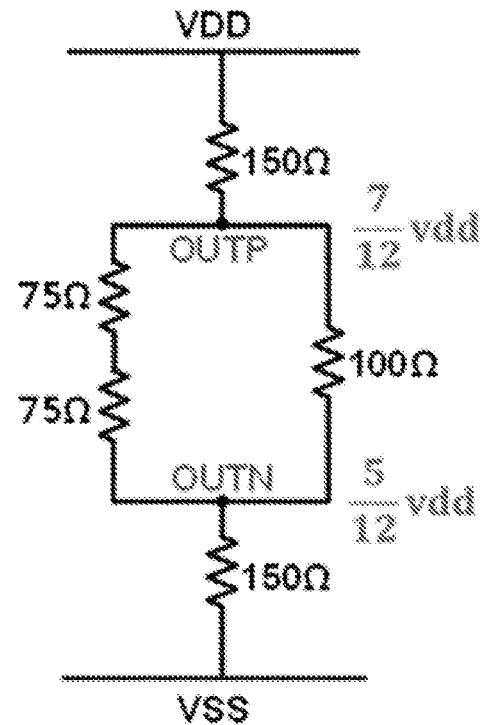
FIG. 6 is a view illustrating a part of an equivalent circuit of a PAM-4 output transmitter according to an embodiment of the disclosure.
Figure 7:
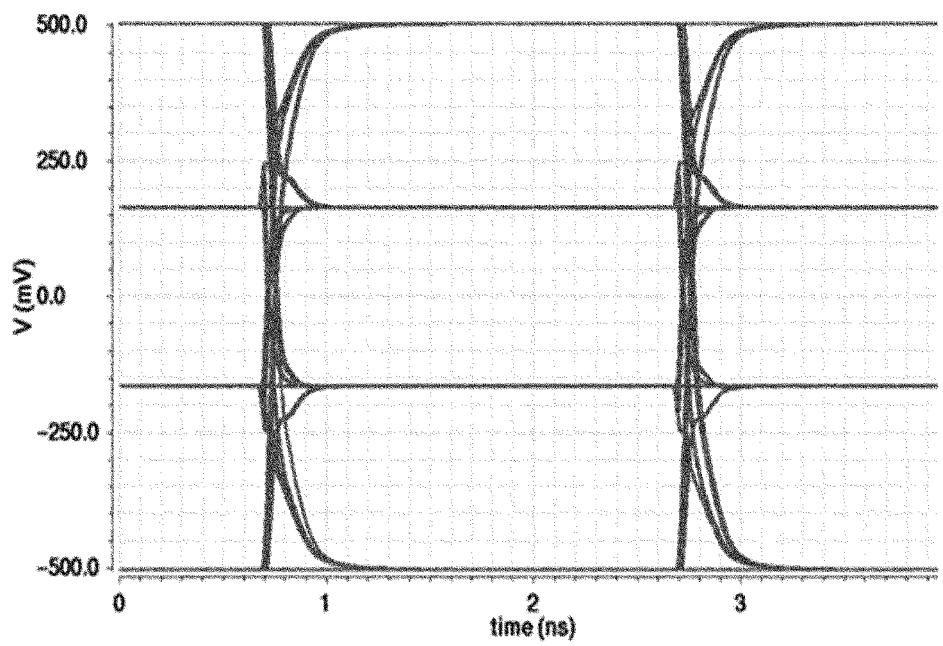
FIG. 7 is a view illustrating a graph showing a differential output of another PAM-4 output transmitter according to an embodiment of the disclosure.

FIG. 2 is a view illustrating a PAM-4 output transmitter according to an embodiment of the disclosure, FIG. 3 is a view illustrating an output of an encoder according to an embodiment of the disclosure, FIGS. 4A-4B are views illustrating an encoding method according to usage of a common voltage switch according an embodiment of the disclosure, FIGS. 5A-5B are views illustrating an equivalent circuit of the PAM-4 driver in FIG. 1, FIG. 6 is a view illustrating a part of an equivalent circuit of a PAM-4 output transmitter according to an embodiment of the disclosure, and FIG. 7 is a view illustrating a graph showing a differential output of another PAM-4 output transmitter according to an embodiment of the disclosure.

In FIG. 2, a PAM-4 output transmitter 200 of the present embodiment includes a first source series terminated SST branch 210, a second SST branch 220 and a common voltage switch 230.

The common voltage switch 230 shorts or opens the first SST branch 210 and the second SST branch 220.

Each of the first SST branch 210 and the second SST branch 220 includes plural unit cells 210a, 210b, 220a and 220b. In FIG. 2, the first SST branch 210 and the second SST branch 220 may include two unit cells 210a and 210b, 220a and 220b, respectively.

The first SST branch 210 includes first unit cells 210a and 210b, and the second SST branch 220 includes second unit cells 220a and 220b. The first SST branch 210 may output a signal in response to a signal outputted from an encoder. This will be described below.

As shown in FIG. 2, each of the first SST branch 210 and the second SST branch 220 includes two unit cells, wherein every unit cell has the same circuit. Hereinafter, the circuit of the unit cell will be described in detail.

The unit cell includes plural transistors, respectively. For example, a first unit cell includes a first transistor to a fourth transistor, a second unit cell has a fifth transistor to an eighth transistor, a third unit cell includes a ninth transistor to a twelfth transistor, and a fourth unit cell has a thirteenth transistor to a sixteenth transistor.

The transistors included in the unit cell may be selectively turned on in response to an input signal outputted from an encoder. Particularly, a part of the transistors included in the first SST branch 210 may be selectively turned on according to the input signal outputted from the encoder. A part of the transistors included in the second SST branch 220 may be selectively turned on in response to a negative signal of the input signal.

In FIG. 2, a first input signal and a second input signal may be inputted to the first unit cell, and negative signals of the first input signal and the second input signal may be inputted to the fourth unit cell. A third input signal and a fourth input signal may be inputted to a second unit cell, and negative signals of the third input signal and the fourth input signal may be inputted to the third unit cell.

The first unit cell 210a and the second unit cell 210b included in the first SST branch 210 have different positive resistance. Here, a first resistor and a second resistor may be set so that positive resistance of the first unit cell 210a is twice positive resistance of the second unit cell 210b.

The circuit of the unit cell in the second SST branch 220 may have reverse circuit of the unit cell in the first SST branch 210 so that differential voltages are outputted from both terminals of the first SST branch 210 and the second SST branch 220 according as the first SST branch 210 and the second SST branch 220 become short or open by the common voltage switch 230.

The third unit cell 220a and the fourth unit cell 220b included in the second SST branch 220 have different positive resistance. Here, a third resistor and a fourth resistor may be set so that positive resistance of the fourth unit cell 220b is twice positive resistance of the third unit cell 220a.

The ratio of on resistance and the positive resistance of the transistor included in the first unit cell to the fourth unit cell may be 1:3.

The transistors may be selectively activated by adjusting a control voltage applied to gate electrodes of the transistors in the first unit cell to the fourth unit cell. The circuit of the unit cell will be described below.

Hereinafter, the operation of the unit cells will be described through the circuit of the first SST branch 210 for convenience of understanding and description. The circuit of the second SST branch 220 has the same structure as a reverse circuit of the first SST branch 210, and thus a repeated explanation will not be given.

Briefly, the positive resistance of the first unit cell may be different from that of the second unit cell. In an embodiment, the positive resistance of the first unit cell may be twice the positive resistance of the second unit cell. For example, the positive resistance of the first unit cell may be set to 112.5Ω, and the positive resistance of the second unit cell may be set to 56.25Ω.

Basic structure of the first unit cell and the second unit cell is the same, and thus only the circuit of the first unit cell will be described.

The first unit cell includes four transistors (a first transistor, a second transistor, a third transistor, a fourth transistor).

The first transistor and the second transistor may be PMOS transistors, and the third transistor and the fourth transistor may be NMOS transistors.

Gate electrodes of the first transistor and the fourth transistor may be connected to control voltage terminals, respectively. That is, an impedance calibration block may output a first control voltage and a second control voltage. Here, a first control voltage terminal may be connected to the gate electrode of the first transistor, and a second control voltage terminal may be connected to the gate electrode of the fourth transistor.

Accordingly, the on resistance of the transistor (i.e. the second transistor and the third transistor) in the first unit cell may be controlled through the gate electrodes of the first transistor and the fourth transistor connected to the first control voltage terminal and the second control voltage terminal.

Particularly, a source electrode of the first transistor may be connected to a reference power supply (VDD), its gate electrode may be connected to the first control voltage terminal, and its drain electrode may be connected to a source electrode of the second transistor.

A gate electrode of the second transistor is connected to a first input signal terminal, and its drain electrode is connected to a drain electrode of the third transistor.

A gate electrode of the third transistor is connected to a second input signal terminal, and its source electrode is connected to a drain electrode of the fourth transistor.

The gate electrode of the fourth transistor is connected to the second control voltage terminal VBN, and its source electrode is connected to a ground.

The drain electrode of the second transistor and the drain electrode of the third transistor are connected to a resistor. Here, a positive resistance of the resistor connected to the drain electrode of the second transistor and the drain electrode of the third transistor may be three times higher than the on resistance used for operating the second transistor and the third transistor.

In an embodiment, the transistors included in the unit cell may be activated in response to the first control voltage and the second control voltage connected to the gate electrodes of the first transistor and the fourth transistor. Here, the on resistance of the transistor controlled by the first control voltage and the second control voltage may be ⅓ times higher than the positive resistance of the resistor connected to the drain electrodes of the second transistor and the third transistor.

The first SST branch 210 may include the first unit cell and the second unit cell, and the positive resistance of the first unit cell may be different from that of the second unit cell. Here, the positive resistance of the first unit cell may be twice the positive resistance of the second unit cell.

The basic circuit and operation of the second unit cell is the same as in the first unit cell, a repeated explanation will not be given.

As shown in FIG. 2, basic circuit of the third unit cell and the fourth unit cell included in the second SST branch 220 are the same as in the first unit cell and the second unit cell.

It is designed that the positive resistance of a third resistor connected to the third unit cell of the second SST branch 220 is identical to that of a second resistor connected to the second unit cell of the first SST branch 210 so that the second unit cell of the first SST branch 210 and the third unit cell of the second SST branch become short or open by the common voltage switch 230. Differential voltages may be outputted from both terminals of the first resistor in the first unit cell and a fourth resistor in the fourth unit cell according as the second resistor and the third resistor become short or open by the common voltage switch 230. As a result, the positive resistance of the first resistor in the first unit cell of the first SST branch 210 may be identical to that of the fourth resistor in the fourth unit cell of the second SST branch 220.

It may be designed that the positive resistance of the second resistor and the third resistor is half the positive resistance of the first resistor and the fourth resistor.

The other structure and operation are the same, and thus a repeated explanation will not be given.

However, a level of the input signal generated with most significant bit MSB and least significant bit LSB outputted from the encoder of the present embodiment may be different from a level of PAM-4 output.

Accordingly, the encoder may output a fixed signal based on the MSB and the LSB to the PAM-4 output transmitter according to its own encoding method.

In an embodiment, the encoder may output a signal based on the MSB and the LSB as shown in FIG. 3.

An encoding method using the MSB and the LSB according to an embodiment of the disclosure will be described in detail with reference to accompanying drawing FIGS. 4A-4B.

The encoding method when a common voltage switch H3 is used is shown in FIG. 4A.

An inverted value of the MSB may be inputted to a first buffer PUP1 and a second input buffer NDN1 connected to the first unit cell of the first SST branch 210. The encoder may generate the inverted value of the MSB and output the generated inverted value to the first input buffer PUP1 and the second input buffer NDN1.

A NAND gate value of the MSB and the LSB may be inputted to a third input buffer PUB2 connected to the second unit cell, and a NOR gate value of the MSB and the LSB may be inputted to a fourth input buffer NDN2.

An XOR gate value of the MSB and the LSB may be outputted to the common voltage switch 230.

An encoding method when the common voltage switch 230 is not used is shown in FIG. 4B.

An inverted value of the LSB may be inputted to the first input buffer PUP1 and the second input buffer NDN1 connected to the first unit cell of the first SST branch 210 when the common voltage switch H3 is not used. The encoder may generate the inverted value of the LSB and output the generated inverted value to the first input buffer PUP1 and the second input buffer NDN1.

An inverted value of the MSB may be inputted to the third input buffer PUB2 and the fourth input buffer NDN2 connected to the second unit cell, and an inverted value of the reference power supply VDD may be outputted to the common voltage switch H3.

A value inputted to the input buffer in the second SST branch 220 is a reverse value of a value inputted to the input buffer of the first SST branch.

FIGS. 5A-5B are views illustrating an equivalent circuit for calculating signaling power of conventional PAM-4 output transmitter in FIG. 1, and FIG. 6 is a view illustrating an equivalent circuit for calculating signaling power of the PAM-4 output transmitter according to an embodiment of the disclosure.

FIG. 5A shows an equivalent circuit when the MSB and the LSB is (1,1) or (0,0), and FIG. 5B illustrates an equivalent circuit when the MSB and the LSB is (1,0) or (0,1).

The signaling power in FIG. 5A equals to $$P = \frac{vdd^2}{200} = \frac{vdd^2}{4R} (R = 50\Omega),$$

and the signaling power in FIG. 5B equals to $$P = \left( \frac{vdd - \frac{7}{12}vdd}{1.5R} + \frac{vdd - \frac{5}{12}vdd}{3R} \right) vdd = \frac{17vdd^2}{36R}.$$

As a result, total signaling power of the equivalent circuit in the conventional PAM-4 output transmitter equals to $$P_{total} = \frac{1}{2}\left(\frac{vdd^2}{4R} + \frac{17vdd^2}{36R}\right) = \frac{13vdd^2}{36R}.$$

In FIG. 6, the equivalent circuit when the MSB and the LSB is (1,1) or (0,0) is the same in FIG. 5A, but the equivalent circuit when the MSB and the LSB is (1,0) or (0,1) is different.

A signaling power of the equivalent circuit in FIG. 6 equals to $$P = \frac{vdd^2}{\left(6 + \frac{6}{5}\right)R} = \frac{5vdd^2}{36R}.$$

As a result, total signaling power of the equivalent circuit of the PAM-4 output transmitter according to an embodiment of the disclosure equals to $$P_{total} = \frac{1}{2}\left(\frac{vdd^2}{4R} + \frac{5vdd^2}{36R}\right) = \frac{7vdd^2}{36R}.$$

The signaling power of the PAM-4 output transmitter of the disclosure may reduce by approximately 17% compared with the signaling power of the conventional PAM-4 output transmitter.

Differential output of the low power PAM-4 output transmitter of the disclosure is shown in FIG. 7 as an example.

A hardware device described above may be embodied with at least one software module for performing the operation of the disclosure, and vice versa.

The embodiments of the invention described above are disclosed only for illustrative purposes. A person having ordinary skill in the art would be able to make various modifications, alterations, and additions without departing from the spirit and scope of the invention, but it is to be appreciated that such modifications, alterations, and additions are encompassed by the scope of claims set forth below.

The invention claimed is:

1. A power pulse amplitude modulation (PAM-4) output transmitter comprising:
 a first source series terminated (SST) branch including unit cells having transistors which are selectively activated in response to an input signal outputted from an encoder;
 a second SST branch including unit cells having transistors which are selectively activated in response to a negative signal of the input signal; and
 a common voltage switch (H3) configured to short or open the first SST branch and the second SST branch,
 wherein differential signals are outputted from both terminals of the first SST branch and the second SST branch by making the first SST branch and the second SST branch short or open according to an operation of the common voltage switch.

2. The power PAM-4 output transmitter of claim 1, wherein a positive resistance of a resistor included in the first SST branch and the second SST branch is three times higher than an on resistance of the transistors of the first SST branch and the second SST branch, and wherein the on resistance of the transistors is controlled by applying a control voltage to a gate electrode of at least one of the transistors of the first SST branch and the second SST branch.

3. The power PAM-4 output transmitter of claim 1, wherein the unit cells of the first SST branch include a first unit cell and a second unit cell, and the unit cells of the second SST branch include a first unit cell and a second unit cell,
 wherein the transistors of the first unit cell of the first SST branch, the transistors of the second unit cell of the first SST branch, the transistors of the first unit cell of the second SST branch, and the transistors of the second unit cell of the second SST branch respectively include a first transistor, a second transistor, a third transistor and a fourth transistor, and
 wherein the first transistor and the second transistor are p-type metal-oxide-semiconductor (PMOS) transistors, and the third transistor and the fourth transistor are n-type metal-oxide-semiconductor (NMOS) transistors.

4. The power PAM-4 output transmitter of claim 3, wherein a gate electrode of the first transistor is connected to a first control voltage (VBP), and a gate electrode of the fourth transistor is connected to a second control voltage (VBN),
 wherein a gate electrode of the second transistor and a gate electrode of the third transistor are connected to an input buffer, and a drain electrode of the second transistor and a drain electrode of the third transistor are connected to a resistor, and
 wherein an operation of the second transistor and the third transistor is controlled by controlling the first control voltage and the second control voltage.

5. The power PAM-4 output transmitter of claim 4, wherein the resistor includes a first resistor and a second resistor,
 wherein the drain electrode of the second transistor and the drain electrode of the third transistor in the first unit cell are connected to the first resistor,
 wherein the drain electrode of the second transistor and the drain electrode of the third transistor in the second unit cell are connected to the second resistor, and
 wherein a positive resistance of the first resistor is twice a positive resistance of the second resistor.

6. The power PAM-4 output transmitter of claim 5, wherein differential voltages are outputted from both terminals of the first resistor according as the second resistor becomes short or open by the common voltage switch.

7. The power PAM-4 output transmitter of claim 4, wherein the encoder is configured to encode an input value to each of the first unit cell and the second unit cell by applying differently an encoding method based on a most significant bit (MSB) and a least significant bit (LSB) according to whether the common voltage switch is closed or open.

8. The power PAM-4 output transmitter of claim 7, wherein an inverted value of the MSB is inputted to a first input buffer connected to the gate electrode of the second transistor included in the first unit cell of the first SST branch and a second input buffer connected to the gate electrode of the third transistor when the common voltage switch is closed, and an inverted value of the LSB is inputted to the first input buffer and the second input buffer when the common voltage switch is open, wherein a NAND gate value of the MSB and the LSB is inputted to a third input buffer connected to the gate electrode of the second transistor included in the second unit cell when the common voltage switch is closed, and an inverted value of the LSB is inputted to the third input buffer when the common voltage switch is open, and wherein a NOR gate value of the MSB and the LSB is inputted to a fourth input buffer connected to the gate electrode of the third transistor included in the second unit cell when the common voltage switch is closed, and an inverted value of the LSB is inputted to the fourth input buffer when the common voltage switch is open.

* * * * *